United States Patent
Gu et al.

(10) Patent No.: US 9,425,096 B2
(45) Date of Patent: Aug. 23, 2016

(54) AIR GAP BETWEEN TUNGSTEN METAL LINES FOR INTERCONNECTS WITH REDUCED RC DELAY

(71) Applicant: QUALCOMM Incorporated, San Diego, CA (US)

(72) Inventors: Shiqun Gu, San Diego, CA (US); Matthew Michael Nowak, San Diego, CA (US); Jeffrey Junhao Xu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 112 days.

(21) Appl. No.: 14/330,950

(22) Filed: Jul. 14, 2014

(65) Prior Publication Data

US 2016/0013133 A1    Jan. 14, 2016

(51) Int. Cl.
| | |
|---|---|
| *H01L 21/4763* | (2006.01) |
| *H01L 21/768* | (2006.01) |
| *H01L 23/532* | (2006.01) |
| *H01L 23/522* | (2006.01) |
| *H01L 23/14* | (2006.01) |
| *H01L 23/498* | (2006.01) |

(52) U.S. Cl.
CPC ... *H01L 21/76895* (2013.01); *H01L 23/49827* (2013.01); *H01L 23/5222* (2013.01); *H01L 23/53257* (2013.01); *H01L 23/53295* (2013.01); *H01L 23/147* (2013.01); *H01L 23/49816* (2013.01)

(58) Field of Classification Search
CPC .................. H01L 21/76895; H01L 21/7682; H01L 23/5329; H01L 23/53257; H01L 23/4821
USPC ................................ 438/619, 648, 656, 685
See application file for complete search history.

(56) References Cited

U.S. PATENT DOCUMENTS

| | | | |
|---|---|---|---|
| 6,445,072 B1 | 9/2002 | Subramanian et al. | |
| 7,071,532 B2 | 7/2006 | Geffken et al. | |
| 8,053,365 B2* | 11/2011 | Humayun | C23C 16/30 257/486 |
| 2007/0013392 A1 | 1/2007 | Kim et al. | |
| 2012/0080793 A1* | 4/2012 | Danek | H01L 21/28562 257/751 |
| 2013/0075913 A1 | 3/2013 | Cooney, III et al. | |
| 2013/0168809 A1 | 7/2013 | Yen et al. | |
| 2013/0214415 A1* | 8/2013 | Pachamuthu | H01L 21/7682 257/751 |
| 2013/0249102 A1 | 9/2013 | Nakao et al. | |
| 2014/0015034 A1 | 1/2014 | Ryu et al. | |

OTHER PUBLICATIONS

Choi, D., et al., "Crystallographic anisotropy of the resistivity size effect in single crystal tungsten nanowires," Scientific Reports 3, Article No. 2951, Sep. 5, 2013, pp. 1-4.
International Search Report and Written Opinion—PCT/US2015/039886—ISA/EPO—Oct. 5, 2015.

* cited by examiner

*Primary Examiner* — Kevin M Picardat
(74) *Attorney, Agent, or Firm* — Muncy, Geissler, Olds & Lowe, P.C.

(57) ABSTRACT

Systems and methods are directed to a semiconductor device, which includes an integrated circuit, wherein the integrated circuit includes at least a first layer comprising two or more Tungsten lines and at least one air gap between at least two Tungsten lines, the air gaps to reduce capacitance. An interposer is coupled to the integrated circuit, to reduce stress on the two or more Tungsten lines and the at least one air gap. A laminated package substrate may be attached to the interposer such that the interposer is configured to absorb mechanical stress induced by mismatch in coefficient of thermal expansion (CTE) between the laminated package substrate and the interposer and protect the air gap from the mechanical stress.

18 Claims, 10 Drawing Sheets

Step S0

Step S1

Step S2

Step S3

Step S4

Step S5

Step S10

Step S11

Step S12

Step S13

Step S14

Step S15

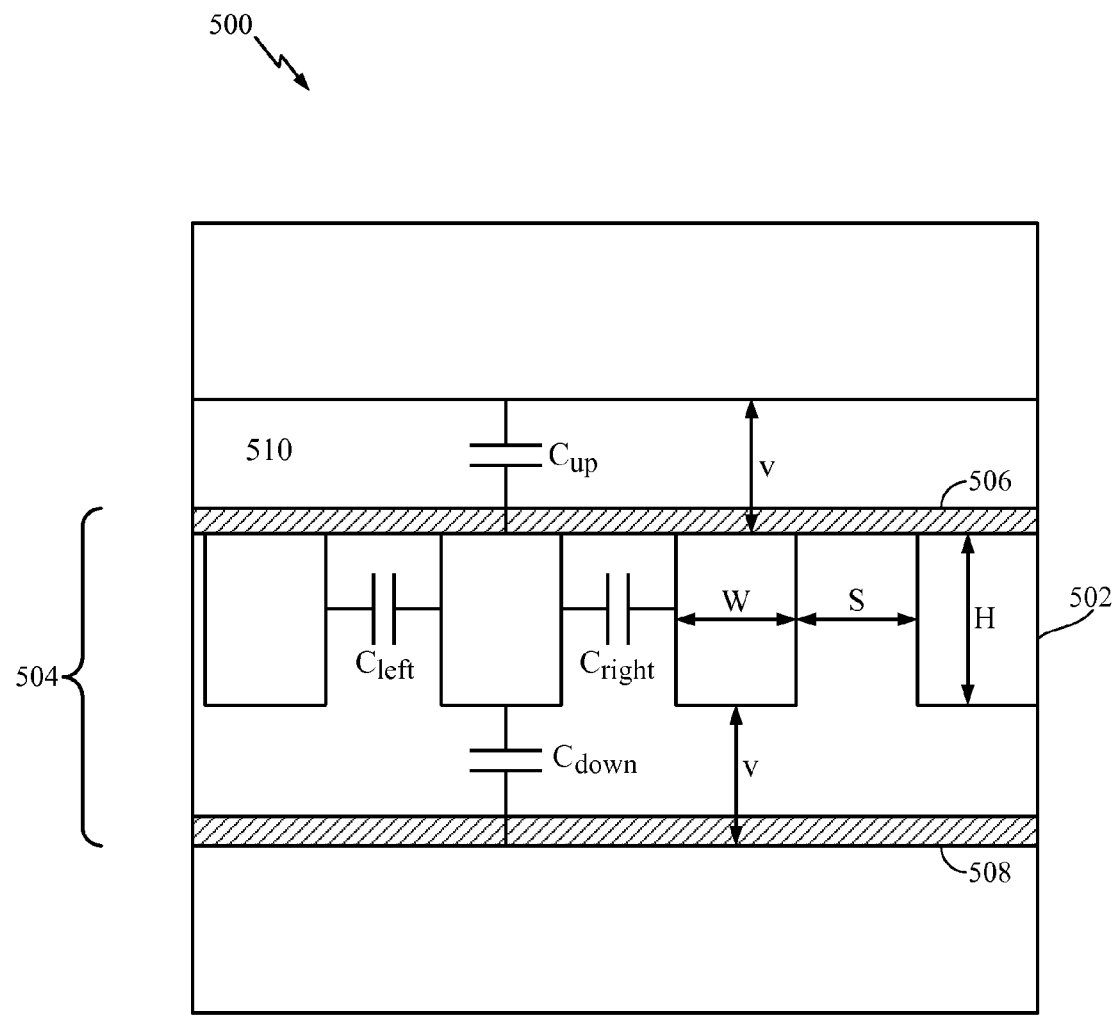
CONVENTIONAL
FIG. 5

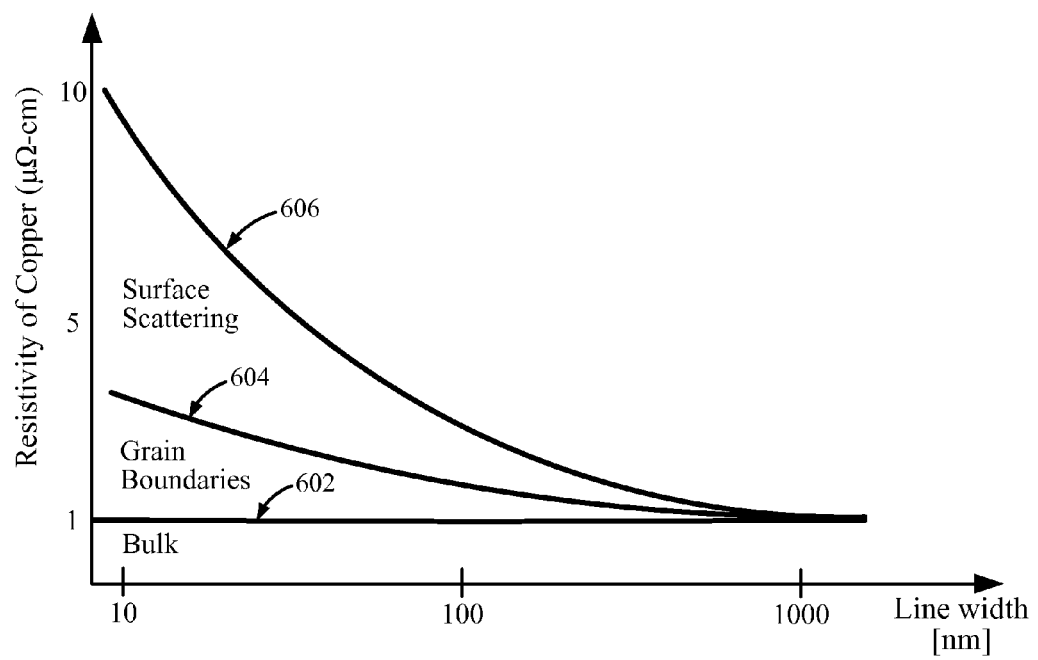
CONVENTIONAL
FIG. 6

AIR GAP BETWEEN TUNGSTEN METAL LINES FOR INTERCONNECTS WITH REDUCED RC DELAY

FIELD OF DISCLOSURE

Disclosed embodiments are directed to integrated circuits configured for low resistance-capacitance (RC) delay and low stress. More specifically, exemplary embodiments relate to integrated circuits comprising metal lines for forming interconnections, where the metal lines are formed from Tungsten (W) with at least one air gap between at least two of the Tungsten metal lines.

BACKGROUND

As semiconductor device technology evolves, there is an ever-present need for shrinking all aspects of semiconductor device sizes. However, design and manufacture of various components of semiconductor devices involves different materials and processes, and accordingly, different components scale differently. For example, while sizes of logic and memory cells on a semiconductor chip shrink rapidly as they evolve into the low nanometer and sub-nanometer scales, it is very challenging to shrink the interconnections between these cells at comparable pace. The interconnections are predominantly made up of metal lines, typically formed by materials such as Copper (Cu). Decreasing the size, in terms of thickness or cross sectional area of these metal lines, leads to various issues.

In a more specific example, with semiconductor device technologies below 10 nm, transistor nodes scale below 10 nm. This imposes limitations on the pitch of the metal lines, as they must scale below ~30 nm. However, for Cu metal lines formed with conventional dual damascene (DD) processes, it is difficult to scale the pitch of the Cu metal lines below 30 nm. At pitches as low as 30 nm, the resistivity of the Cu metal lines (which is inversely proportional to pitch) is very high and high surface or grain scattering is observed. Moreover, increase in resistivity leads to a higher resistance-capacitance product, referred to as "RC delay" or "RC value."

A back-end of line (BEOL) refers to integrated circuit fabrication related to interconnections between various circuit elements such as transistors, resistors, capacitors, etc. It is observed in conventional integrated circuit designs that RC delay of Cu metal lines forms a dominant portion of the BEOL critical circuit delay. Accordingly, there is a need to reduce RC delay due to metal interconnections.

As already seen, for reducing pitch of the metal lines with shrinking device sizes, it is difficult to keep the resistance (R) component of the RC delay related to the metal lines from rising. In conventional designs, it is also difficult to reduce the capacitance (C) component of the RC delay. This is because capacitance is directly proportional to the dielectric constant (K), and current technology has reached limits on lowering K values for Cu metal lines and surrounding dielectric materials used for interlayer protection and mechanical stability in integrated circuit designs. Reducing the K values further will weaken the mechanical strength of the dielectric materials and may lead to undesirable effects, such as, low-K delamination, which negatively impacts reliability and mechanical stability of the integrated circuits.

Therefore, there is a need in the art for interconnections with low RC delay values, which also avoid drawbacks related to weakened stability and reliability.

SUMMARY

Exemplary embodiments are directed to a semiconductor device which includes an integrated circuit. The integrated circuit comprises at least a first layer comprising two or more Tungsten lines and at least one air gap between at least two Tungsten lines. An interposer is coupled to the integrated circuit, to reduce stress on the two or more Tungsten lines and the at least one air gap. In some aspects, a laminated package substrate may be attached to the interposer such that the interposer is configured to absorb mechanical stress induced by mismatch in coefficient of thermal expansion (CTE) between the laminated package substrate and the interposer and protect the air gap from the mechanical stress.

Another exemplary embodiment is directed to a method of forming a semiconductor device. The method comprises forming two or more Tungsten lines in a first layer of an integrated circuit, forming at least one air gap between at least two of the Tungsten lines, and coupling an interposer to the integrated circuit to reduce stress on the Tungsten lines and the air gap.

Yet another exemplary embodiment is directed to a semiconductor device comprising: two or more Tungsten lines in a first layer of an integrated circuit, means for forming at least one air gap between at least two of the Tungsten lines, and coupling means coupled to the integrated circuit, the coupling means to reduce stress on the Tungsten lines and the air gap.

BRIEF DESCRIPTION OF THE DRAWINGS

The accompanying drawings are presented to aid in the description of embodiments of the invention and are provided solely for illustration of the embodiments and not limitation thereof.

FIG. 5 illustrates a conventional integrated circuit with metal line dimensions and schematic representations of capacitance and resistance formations therein.

FIG. 6 illustrates a plot of sample resistivity values for metal lines formed of Copper and Tungsten as a function of their cross sectional areas.

DETAILED DESCRIPTION

Figure 1A:
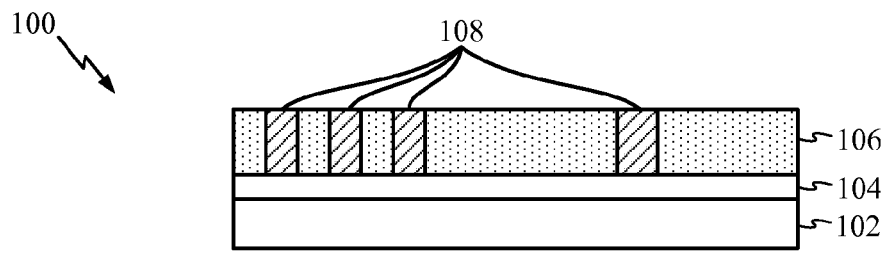
FIGS. 1A-G illustrate an exemplary integrated circuit 100 along with process steps for formation of the exemplary integrated circuit 100, comprising Tungsten lines and at least one air gap between at least two Tungsten lines.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

One or more embodiments are configured to overcome limitations of conventional metal lines formed of Copper that are used for forming interconnections in integrated circuits. In some aspects of this disclosure, metal lines of lower resistivity and higher electromigration reliability characteristics are used instead of conventional Copper metal lines. In the following disclosure, Tungsten (W) is described as the alternative material to Copper for forming metal lines. However, it will be understood that Tungsten is only described as an exemplary material for the sake of description, and aspects of this disclosure may also include metal lines formed from other elements with similar characteristics as Tungsten. For example, some aspects may replace Tungsten with Molybdenum (Mo), Ruthenium (Ru), etc., which also display characteristics of higher electromigration reliability than Cu. Accordingly, while references may be made to "metal lines formed of Tungsten" or "Tungsten metal lines" or "Tungsten lines," in the following description, it will be understood that the above substitutions for Tungsten with Molybdenum (Mo) or Ruthenium (Ru) may be possible in some aspects.

Accordingly, with shrinking device sizes, in the following aspects, Tungsten is seen to display characteristics of high electromigration reliability, while being of comparable or lower resistivity in relation to resistivity of Copper. Thus, low pitch Tungsten may be used in some aspects to form metal interconnections in one or more layers of formation of an exemplary integrated circuit.

Further, it is known in the art that Tungsten metal lines formed from a process of chemical vapor deposition (CVD) have higher resistivity than Tungsten metal lines formed by PVD, due to grain structures and impurity introduced by CVD. See, for example, Choi et al. "Crystallographic Anisotropy Of The Resistivity Size Effect In Single Crystal Tungsten Nanowires," at FIG. 2(b), Scientific Reports 3, Article number: 2591, Published Sep. 5, 2013, hereinafter referred to as the "Choi" reference. Accordingly, in some aspects, Tungsten film deposited by a process of physical vapor deposition (PVD) may be used for exemplary Tungsten metal lines, in order to further lower resistivity of the exemplary Tungsten metal lines.

By way of background, FIG. 5 is provided, with an illustration of a portion of a cross-sectional slice of a conventional integrated circuit 500. The illustrated cross-sectional slice includes a plurality of metal lines 502, running into and out of the page in the depicted view. FIG. 5 can pertain to a back end of line (BEOL) process step, for example. As previously described, BEOL is a well-recognized part of integrated circuit fabrication where interconnections are formed for connecting the various circuit elements, such as transistors, capacitors, resistors, etc., which may be formed on-chip. Metal lines 502 can be in a first layer, and referred to as M1 metal lines, and can be used for local routing or interconnections between local devices such as transistors. Higher level metals such as M2, M3, etc., may be used for routing between logical or functional blocks. In addition to forming M1 metal lines for the local routing of on-chip circuit elements, BEOL can include contacts, insulating layers, interlayer dielectric (ILD) material, other metal levels, and bonding sites for chip-to-package connections. Representatively, FIG. 5 includes illustrations of some of these aspects related to process parameters and dimensions.

In the illustrated example, the depicted metal lines 502 of length "L" (going into and out of the page in the illustration) may be formed in device layer 504 with cap layers 506 and 508 on first and second sides (e.g., top and bottom sides). Bulk ILD 510 is formed on the first side (above cap layer 506). The dimension "W" represents the width and "H," the height of one of the metal lines 502. The dimension "v" represents height of vias leading to metal lines (e.g., M2, M3, etc., not shown) in layers on first and second sides (above and below cap layers 506 and 508). The dimension "s" depicts the separation or distance between two adjacent metal lines 502. For a given M1 metal line 502, capacitors are formed on at least the depicted sides, denoted as $C_{left}$, $C_{right}$, $C_{down}$, and $C_{up}$.

With the above parameters and dimensions, the capacitance of a metal line 502, denoted as $C_{BEOL}$ can be represented by the following expression, where $k_v$ and $k_h$ are effective dielectric constants in vertical and horizontal directions, and $k_{cap}$ and $k_{ILD}$ are effective dielectric constants of the cap layer 506 and bulk ILD 510, for example.

$$C_{BEOL} = \frac{k_V WL}{v} + \frac{k_h HL}{s}$$

Correspondingly, the resistance, $R_{BEOL}$ is given by the expression, where $\rho$ is the resistivity of metal line 502:

$$R_{BEOL} = \frac{\rho L}{HW}$$

The above expressions for $C_{BEOL}$ and $R_{BEOL}$ are used for determining the RC delay. As discussed with reference to conventional technologies relying on Cu for forming metal lines, reducing the dimensions H or W would negatively impact electromigration reliability, due to increased current density. Accordingly, exemplary aspects of this disclosure recognize that elements with lower mean free path than Cu would not suffer from these limitations seen in elements like Cu. For example, for unit length "L," elements such as Tungsten (W), Molybdenum (Mo), and Ruthenium (Ru) can be used with narrow pitch or low W and may still exhibit a much lower mean free path than Cu.

With reference to FIG. 6, a plot of resistivity (in μΩ-cm) of conventional Cu metal lines is shown as a function of line width of the Cu metal lines. More specifically, plots are shown for bulk resistivity (602), resistivity at grain boundaries (604), and resistivity due to surface scattering (606), as a function of line width. As seen, for large line widths of over 1000 nm, resistivity at grain boundaries 604 and due to surface scattering 606 are low, and comparable to bulk resistivity 602 of Cu. However, as line width shrinks, resistivity at grain boundaries 604 and due to surface scattering 606 is seen to increase. At line widths of 10 nm, which pertain to state of the art technology, resistivity at grain boundaries 604 is seen to be much higher than bulk resistivity 604, and the resistivity due to surface scattering 606 is seen to be extremely high. Thus, at these line widths, metal lines made of Cu display extremely high surface scattering effects due to low electromigration reliability. On the other hand, resistivity of elements like Tungsten remains relatively stable for shrinking line widths, which is a huge improvement over Cu, especially at low line widths such as 10 nm. Additionally, elements such as Tungsten, Molybdenum, and Ruthenium also display characteristics of higher melting points (W is about 3.1 times that of Cu, Mo is about 2.4 times that of Cu, and Ru is about 2.3 times that of Cu) and lower diffusivity.

Accordingly, exemplary aspects include metal lines formed of materials such as W, Ru, Mo, etc., and of lower or narrower pitch than conventional Cu based metal lines.

Moreover, in some aspects, at least one air gap is interspersed between at least two of the Tungsten metal lines, which leads to even further reduction in capacitance. As such, air gaps formed in fine or narrow spaces (e.g., less than 30 nm) between fine pitch low level or heavy/dense metal lines such as Tungsten metal lines reduce dielectric constant (K) and capacitance. In the low metal pitch range such as 30-36 nm semiconductor device technology, Tungsten lines with air gaps in between them can lower capacitance as well as have low resistivity. Further, in some aspects, using Tungsten lines formed from a physical vapor deposition (PVD) and/or Fluorine free (FF) process is seen to eliminate a barrier layer and reduce carrier FF path or surface sputtering. In some aspects, the configuration of the integrated circuit further comprises a coupling means or an interposer structure to minimize stress on the Tungsten lines formed with at least one air gap. Accordingly, exemplary aspects are directed to integrated circuits with interconnects configured for low RC delay values with improved reliability and stability.

An exemplary semiconductor device comprising an integrated circuit will now be described with reference to FIGS. 1A-F in conjunction with a process of forming the exemplary integrated circuit. Accordingly, starting at FIG. 1A, an initial stage in the formation of integrated circuit (IC) 100 is illustrated as processing step S0, wherein a cap means such as first cap layer 104 is formed on silicon or first semiconductor device layer 102. Device layer 102 may include semiconductor devices such as transistors, resistors, capacitors, etc. One or more first metal lines 108 are formed on first cap layer 104, within first dielectric layer 106. First Metal lines 108 may be formed from Fluorine free Tungsten (FF W). Further, first metal lines 108 may be formed by using a dual damascene (DD) or etching process on first dielectric layer 106, followed by deposition of metal lines 108 and chemical mechanical polishing (CMP). In some aspects, first dielectric layer may be formed from undoped silicon glass (USG) oxide or other low K dielectric materials.

Figure 1B:
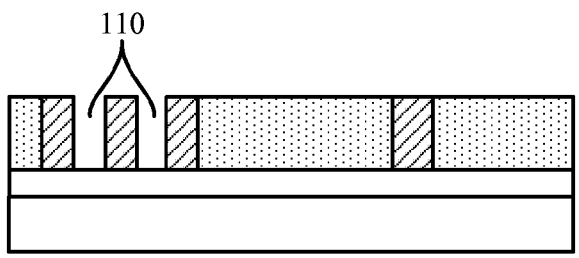

In the next processing step S1 illustrated in FIG. 1B, first dielectric layer 106 is patterned and etched or removed from in between at least two of first metal lines 108, to form first air gaps 110. At least two of the metal lines 108 may be narrowly separated such that at least one of the air gaps 110 may have narrow spacing (e.g., <30 nm).

Figure 1C:
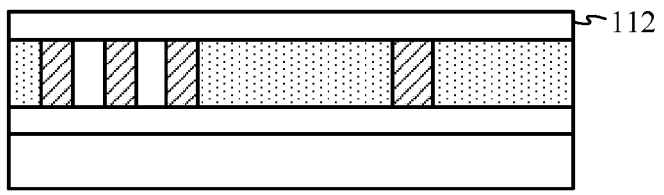

In FIG. 1C, processing step S2 is illustrated, wherein cap means such as second cap layer 112 is formed on top of remaining first dielectric layer 106, first metal lines 108, and first air gaps 110.

In some integrated circuit designs, IC 100 may be formed from a single layer comprising the remaining first dielectric layer 106, first metal lines 108, and first air gaps 110. It is possible that connecting means such as vias can be formed in second cap layer 112 to connect first metal lines 108 to a semiconductor chip or package, for example, using flip chip technology. In such cases, the following steps S3-S5 may not be present. Accordingly, steps S3-S5 will be described below as optional, for some aspects of IC 100 which may include additional layers of metal lines.

Figure 1D:
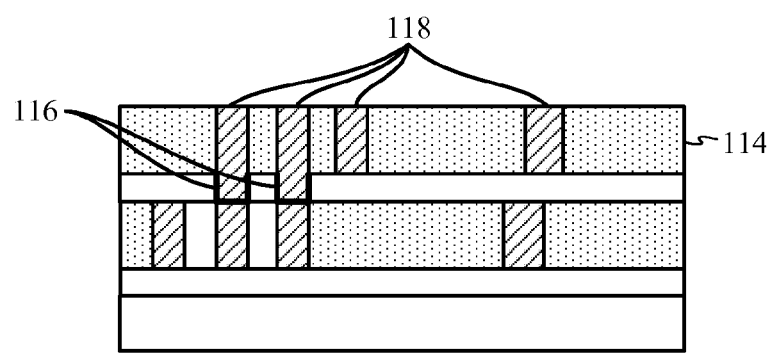

Accordingly, with reference to FIG. 1D, processing step S3 is illustrated where a second layer of metal interconnections is formed over second cap layer 112. It will be noted that although cap layers such as second cap layer 112 have been illustrated as a single layer, they may alternatively be formed as composite cap layers comprising two or more layers. As shown, second dielectric layer 114 is formed on second cap layer 112. First vias 116 are formed through second cap layer 112 and connect first metal lines 108 to second metal lines 118 formed in second dielectric layer 114. Second metal lines 118 may be formed in second dielectric layer 114 through similar processes as first metal lines 108 in first dielectric layer 106, i.e., from FF W formed by a DD or etch process followed by deposition and CMP.

Figure 1E:
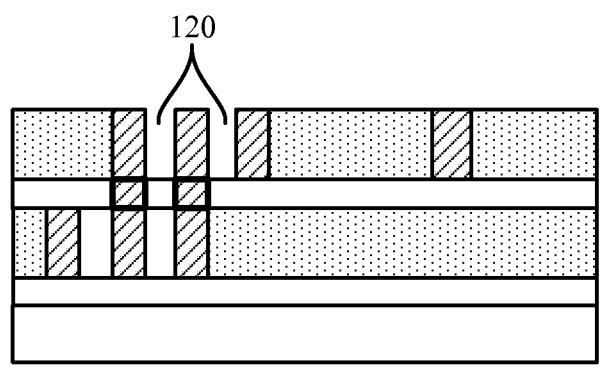

Continuing on to processing step S4 illustrated in FIG. 1E, air gaps 120 may be formed in second dielectric layer 114, for example, in a similar manner as formation of air gaps 110 in processing step S1 of FIG. 1B above. More specifically, air gaps 120 may be formed by patterning second dielectric layer 106 and etching or removing second dielectric layer 106 from in between at least two of second metal lines 118. Air gaps 120 may also have narrow spacing or width similar to air gaps 110. While air gaps 120 are illustrated as being vertically staggered in relation to air gaps 110 in FIG. 1E, it will be understood that this is purely for the sake of an exemplary illustration and not to be construed as a requirement or limitation. As such, any number of layers similar to the first and second layers above may be formed with one or more of the layers comprising at least two metal lines formed from Tungsten and at least one air gap formed in between the at least two metal lines.

Figure 1F:
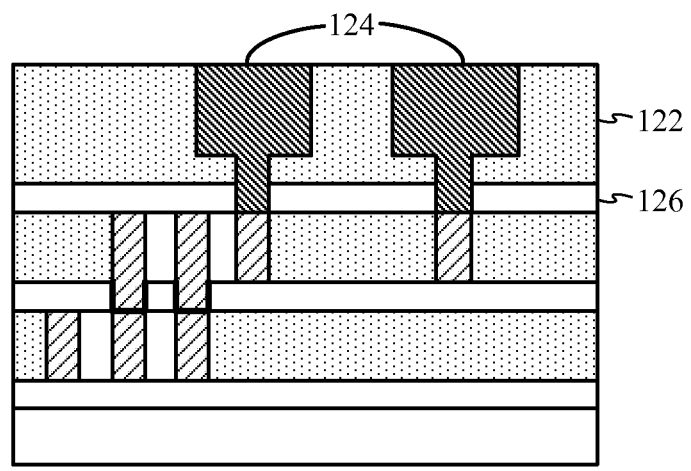

With reference to FIG. 1F, processing step S5 illustrated for IC 100. An additional third layer is illustrated in FIG. 1F, with third metal lines 124, which may be formed from Copper or other thick metallic material. Once again, this third layer, and processing step S5 is optional, and may be used for forming longer interconnections between subsystems in a package, for example, where larger pitch width may be allowable, and as such, larger RC delays may be tolerated. Third metal lines 124 may be formed in third dielectric layer 122 using conventional process steps on top of third cap layer 126 separating second dielectric layer 114 and third dielectric layer 122. Third metal lines 124 may be directly connected to second metal lines 118 by forming corresponding holes in third cap layer 126. Alternatively, vias may be used (not shown) for connections between third metal lines 124 and second metal lines 118.

In IC 100, it is possible that the introduction of the air gaps (e.g., 110 and 120) may introduce additional stress or induce weakening of mechanical stability. The coefficient of thermal expansion (CTE) of IC 100 comprising air gaps (e.g., 110, 120) may differ from the coefficient of thermal expansion of a die based on Silicon and conventional metal wires. Accordingly, the mismatch created in thermal expansion due to introduction of the air gaps in IC 100 may need to be rectified before attachment of IC 100 to a semiconductor package or silicon die. These effects are described in relation to FIG. 1G, which illustrates IC 100 packaged in a flip-chip package structure.

Figure 1G:
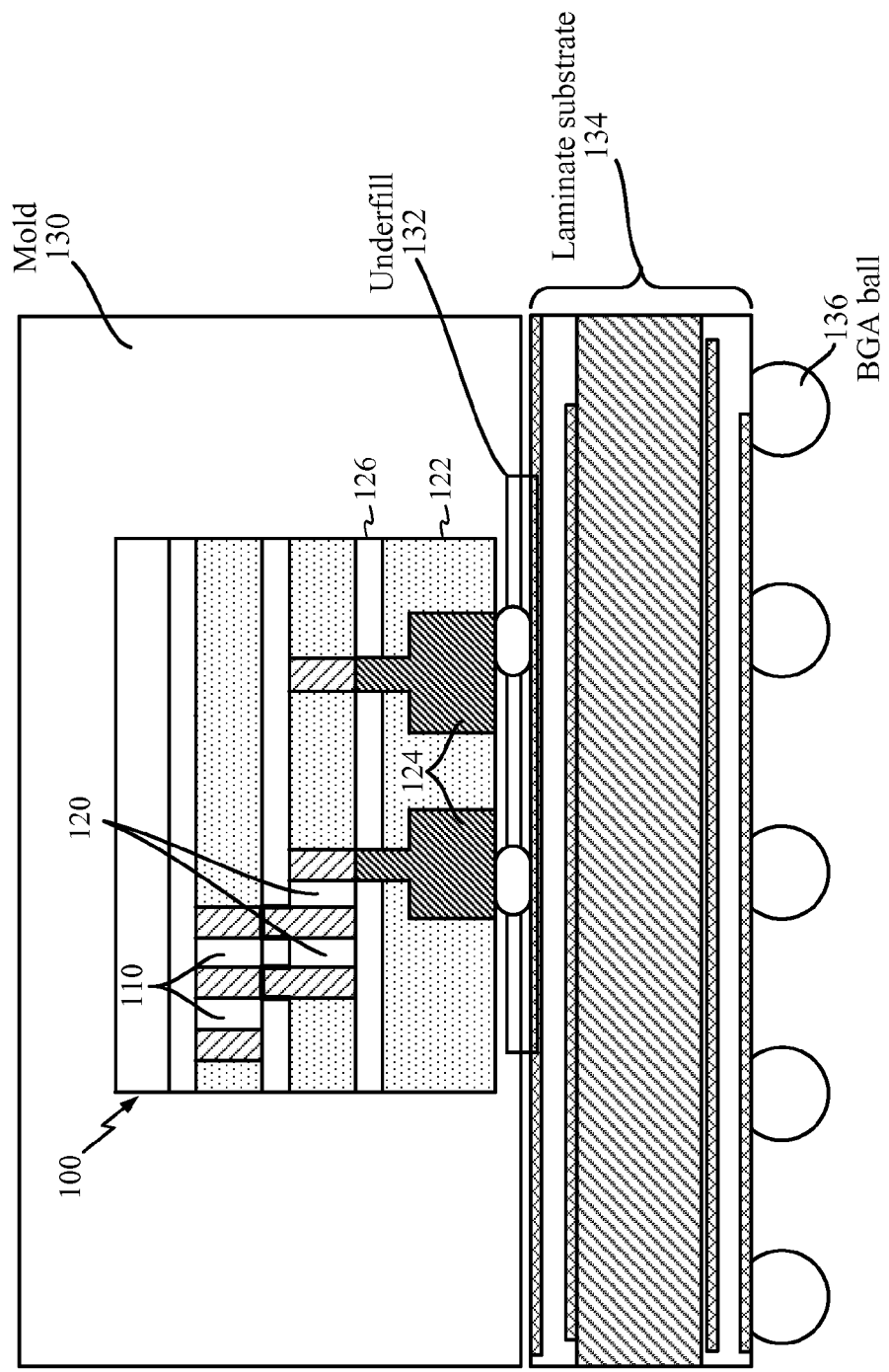

With reference to FIG. 1G, IC 100 of FIG. 1F is illustrated, encapsulated or packaged in a flip-chip package structure. Accordingly, IC 100 is flipped representatively in a vertical direction, and an underfill layer 132 is added to assist with bonding of metal lines 124 to laminate substrate 134. Also illustrated in FIG. 1G are ball-grid array (BGA) solder balls 136 and a mold 130 as are known in the art for flip-chip packages. Laminate substrate 134 may have a coefficient of thermal expansion (CTE) in the order of 10-30 ppm/C, which differs from the Si die used to form IC 100. Underfill layer 132 may also contribute to the mismatch in CTE between laminate substrate 134 and IC 100, which introduces undesirable mechanical stress on air gaps 110, 120.

Figure 2A:
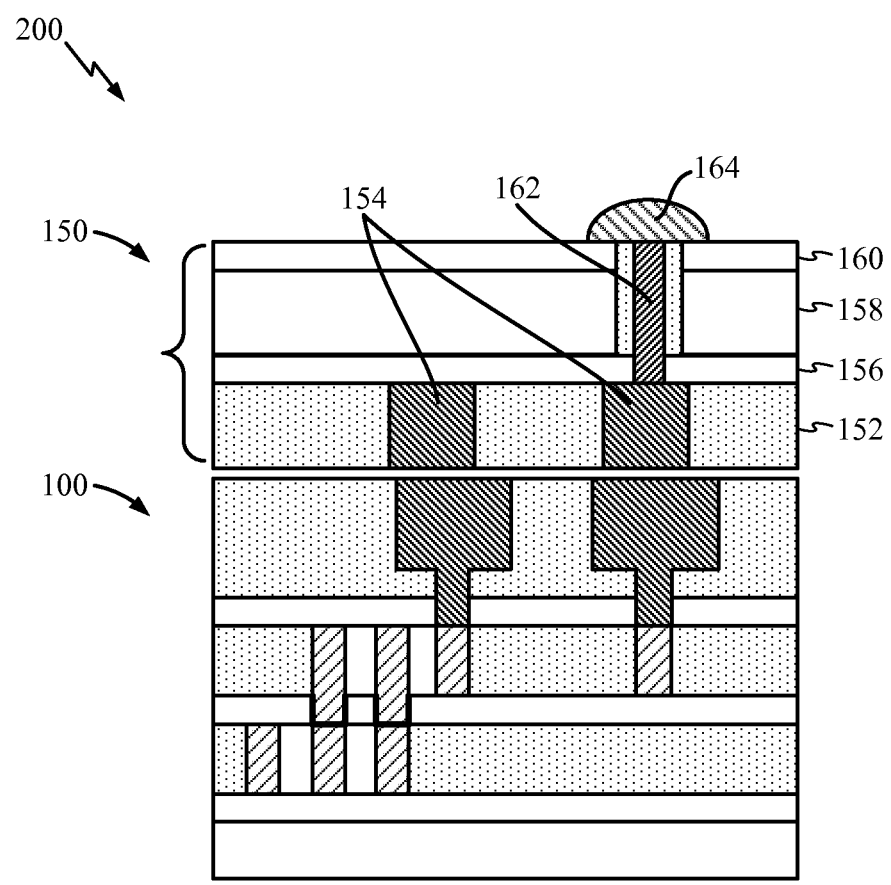
FIGS. 2A-B illustrates another exemplary semiconductor package comprising an exemplary integrated circuit and an interposer 150.

With reference now to FIG. 2A, semiconductor device 200 is illustrated comprising IC 100 attached to a coupling means or interposer 150. Interposer 150 may be attached to IC 100 in order to improve stability, balance coefficient of thermal expansion, and reduce stress on IC 100 comprising air gaps (e.g., 110, 120) formed between metal lines (e.g., 108, 118).

Figure 2B:
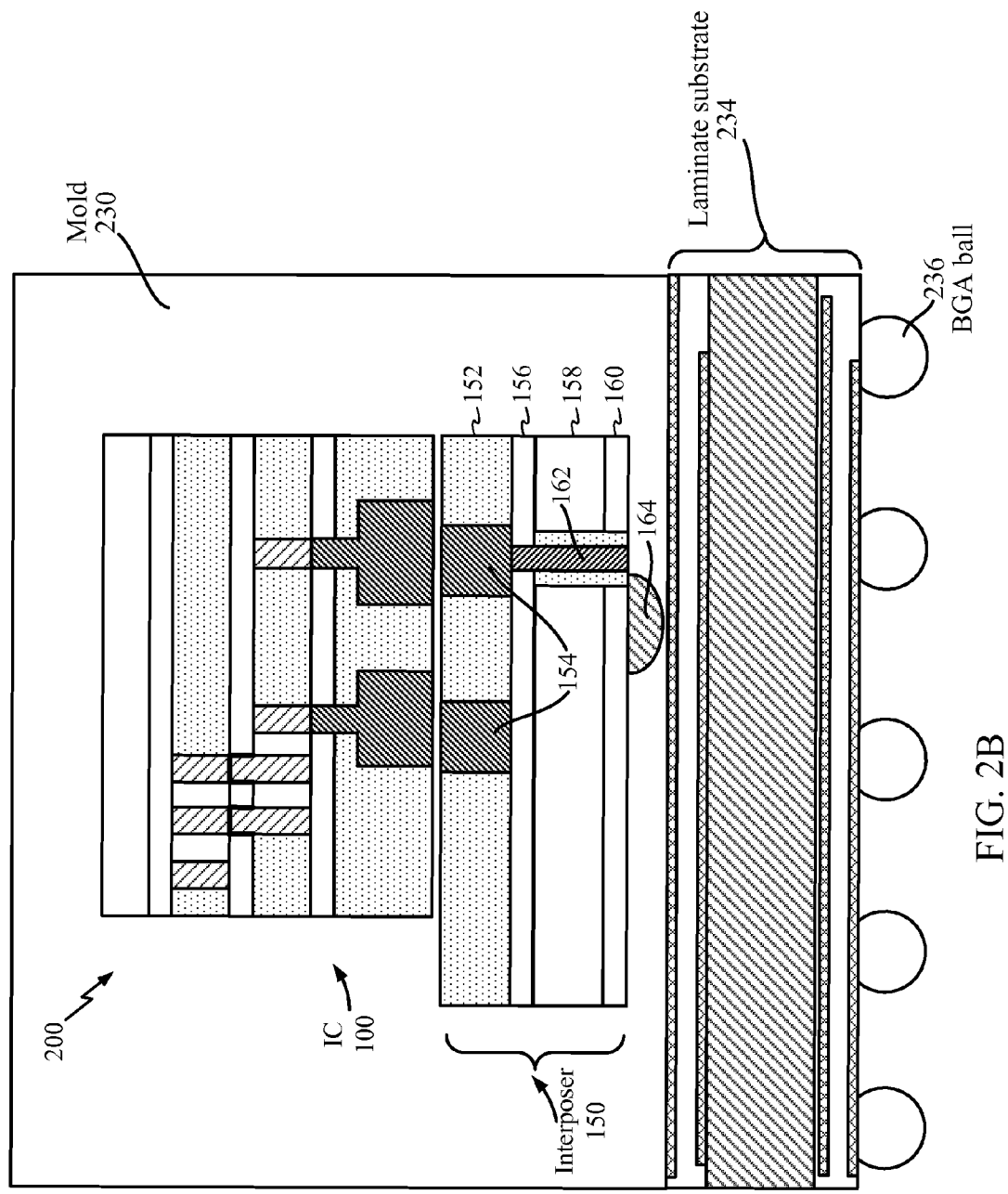

Similar to the flip-chip package shown in FIG. 1G, FIG. 2B illustrates semiconductor device 200 packaged in flip-chip package technology, where semiconductor 200 is flipped and attached to a laminated package substrate such as, laminate substrate 234. Unlike the case of FIG. 1G where IC 100 was directly attached to laminate substrate 134 (with the use of an optional underfill 132), FIG. 2B shows semiconductor device 200 attached to laminate substrate 234 through interposer 150. With combined reference to FIGS. 2A-B, interposer 150 may be made of Si or glass and may be configured to reduce effects of CTE mismatch between IC 100 and laminate substrate 234. Interposer 150 may be attached to IC 100 by means of stacking interposer 150 on IC 100 as shown, and bonding interposer 150 to IC 100. Bonding interposer 150 to IC 100 can be achieved by means of a "ubump", Cu—Cu bonding, or Cu—Cu and oxide-oxide hybrid bonding as known in the art. When Cu—Cu bonding is used, the occurrence of Si or inorganic materials between interposer 150 and IC 100 will be minimized or eliminated. Further, any stress that may be induced on the air gaps (e.g., 110, 120) due to mismatch in coefficient of thermal expansion (CTE) between interposer 150 and IC 100 will also be minimized. In this manner, possible mechanical stress on the air gap structures can be minimized. In addition, with oxide to oxide or Cu to Cu bonding, there will be no need to place any underfill material such as underfill layer 132 of FIG. 1G between interposer 150 and IC 100, which reduces CTE mismatch between IC 100 and laminate substrate 234. Accordingly any induced stress to air gaps 110, 120 due to CTE mismatch are also minimized.

With continuing reference to FIGS. 2A-B, interposer 150 may comprise fourth dielectric layer 152, with fourth metal lines 154, which may also be formed from Copper or similar material as third metal lines 124. As such, fourth metal lines 154 may be connected to third metal lines 124 through direct metal-metal connection to provide the aforementioned Cu—Cu bonding. Fourth cap layer 156 may be formed on top of fourth metal lines 154 and fourth dielectric layer 152. Second semiconductor device layer 158 may be formed on fourth cap layer 156 and fifth cap layer 160 may be formed on top of second semiconductor device layer 158. Via 162 may be formed in fifth cap layer 160, second semiconductor device layer 158, and fourth cap layer 156 to connect to solder ball 164 to fourth metal lines 154. FIG. 2B also illustrates ball-grid array (BGA) solder balls 236 and a mold 230 as are known in the art for flip-chip packages.

With reference now to FIGS. 3A-F another semiconductor device comprising an exemplary integrated circuit will now be described in conjunction with a process of forming the exemplary integrated circuit. FIGS. 3A-F illustrate steps S10-15 for forming IC 300, where IC 300 may be similar to IC 100 but formed through the alternative processes of steps S10-15. Accordingly, starting at FIG. 3A, an initial stage in the formation of integrated circuit (IC) 300 is illustrated as processing step S10, wherein first cap layer 304 is formed on silicon or first semiconductor device layer 302. First metal layer 306, comprising, for example, Tungsten, is deposited on first cap layer 304, for example through a physical vapor deposition (PVD) process. Resist or hardmask patterns 308 are formed on first metal layer 306.

Figure 3A:
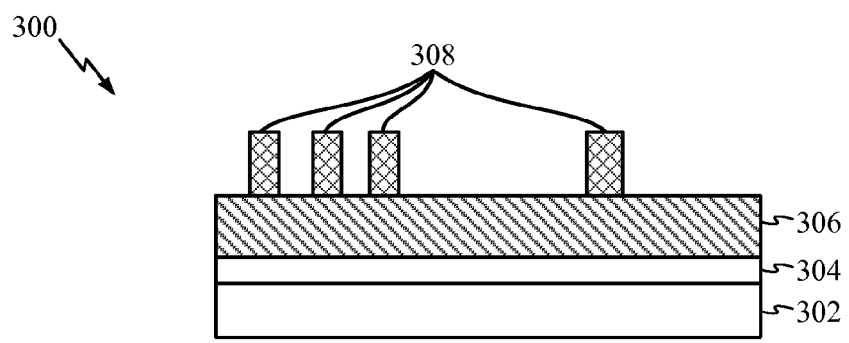
FIGS. 3A-F illustrate another exemplary integrated circuit 300 along with process steps for formation of the integrated circuit 300, comprising Tungsten lines and at least one air gap between at least two Tungsten lines.
Figure 3B:
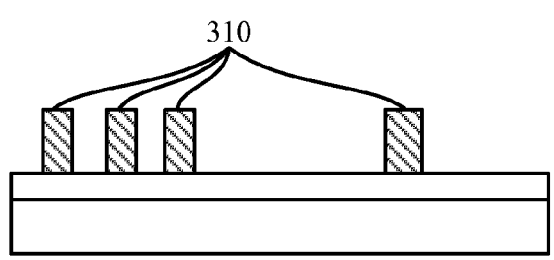

Referring now to FIG. 3B, in processing step S11, first metal layer 306 is etched away under patterns 308, with first metal lines 310 remaining.

Figure 3C:
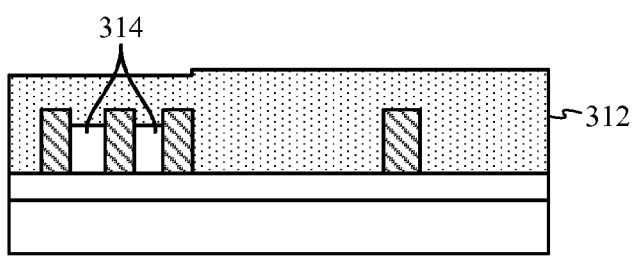

In FIG. 3C, processing step S12 is illustrated where first dielectric layer 312 is deposited to enclose first metal lines 310, but first air gaps 314 are protected from deposition of first dielectric layer 312. In more detail, patterns 308 are spaced such that at least one of the air gaps 314 is narrow enough to cause pinching of first dielectric layer 312 deposition in the narrow area taken up by air gaps 314, which prevents first dielectric layer 312 from filling the void in the narrow areas, resulting in the formation of the air gaps 314.

Figure 3D:
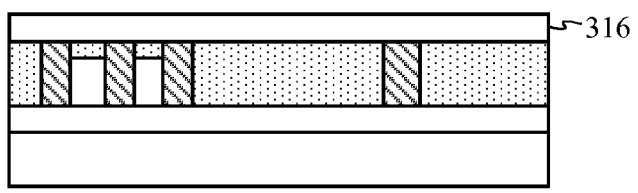

In FIG. 3D, step S13 is illustrated where, optional CMP is performed to remove a top portion of first dielectric layer 312. Second cap layer 316 is deposited on first metal lines 310 and the remaining first dielectric layer 312. A small portion of first dielectric layer 312 may have wicked into the narrow spaces which comprise first air gaps 314, and may protect the trapped air in the air gaps 314 during deposition of second cap layer 316. Alternatively, in some aspects, rather than depositing a separate cap layer such as second cap layer 316 on first dielectric layer 312, a top portion of first dielectric layer 312 may itself be caused to act as a cap layer. For example, a larger portion or top portion of first dielectric layer 312 may be retained by controlling the CMP process accordingly and this retained top portion of first dielectric layer 312 may act as the second cap layer shown as second cap layer 316.

Once again, in some integrated circuit designs, IC 300 may be formed from a single layer and the following process steps may not be required. With a single layer, it may be possible that vias can be formed in second cap layer 316 to connect first metal lines 310 to a semiconductor chip or package, for example, using flip chip technology. In such cases, the following steps S14-S15 may not be present. Accordingly, steps S14-S15 will be described below as optional, for some aspects of IC 300 which may include additional layers of metal lines.

Figure 3E:
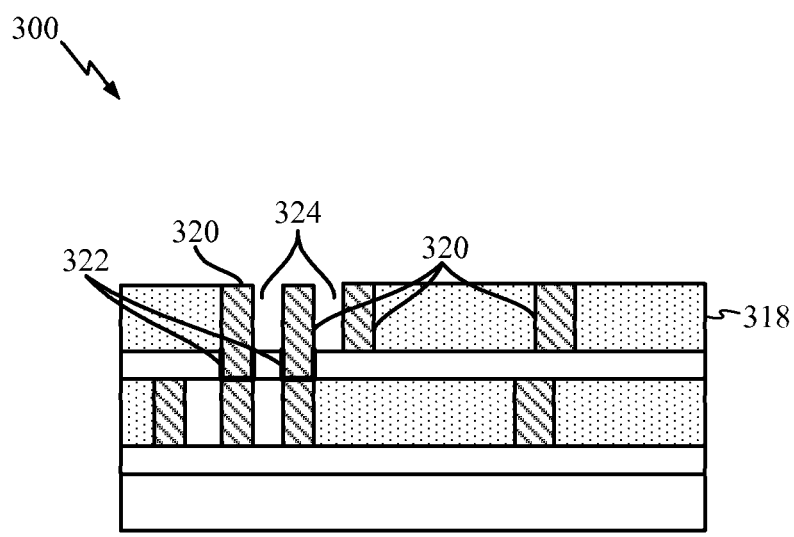

Accordingly, with reference to FIG. 3E, processing step S14 is illustrated where a second layer of metal interconnections is formed over second cap layer 316. More specifically, second dielectric layer 318 is formed on second cap layer 316. First vias 322 are formed through second cap layer 112 and connect first metal lines 310 to second metal lines 320 formed in second dielectric layer 318. Second metal lines 320 may be formed in second dielectric layer 318 through similar processes as first metal lines 310 by deposition of Tungsten, for example, and patterning, followed by etching, and deposition of second dielectric layer 318 to form air gaps 324. Air gaps 324 may also be of narrow width or spacing.

Once again, while air gaps 324 are illustrated as being vertically staggered in relation to air gaps 314, it will be understood that this is purely for the sake of an exemplary illustration and not to be construed as a requirement or limitation. As such, any number of layers similar to the first and second layers above may be formed with one or more of the layers comprising at least two metal lines formed from Tungsten and at least one air gap formed in between the at least two metal lines.

Figure 3F:
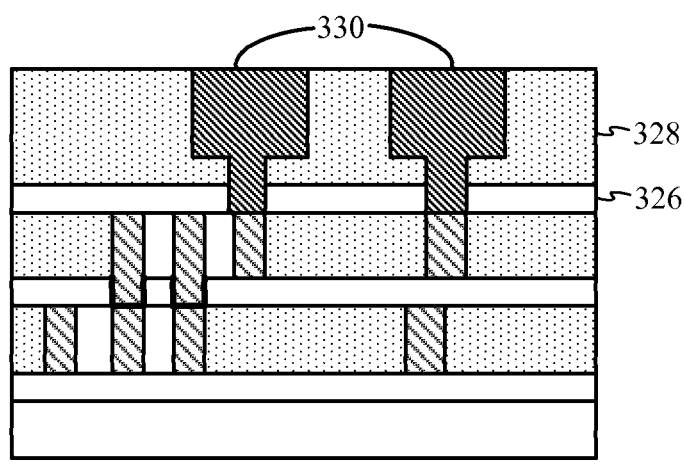

With reference to FIG. 3F, processing step S15 illustrated for IC 300. An additional third layer is illustrated in FIG. 3F, with third metal lines 330, which may be formed from Copper or other thick metallic material. This third layer with third metal lines 330 may be used for forming longer interconnections between subsystems in a package, for example, where larger pitch width may be allowable, and as such, larger RC delays may be tolerated. Third metal lines 330 may be formed in third dielectric layer 328 using conventional process steps on top of third cap layer 326 separating second dielectric layer 318 and third dielectric layer 328. Third metal lines 330 may be directly connected to second metal lines 320 by forming corresponding holes in third cap layer 326. Alternatively, vias may be used (not shown) for connections between third metal lines 330 and second metal lines 320.

It will be observed that the structure of IC 300 in FIG. 3F is similar to that of IC 100 in FIG. 1F. As such, IC 300 may also be attached to a coupling means or an interposer similar to interposer 150, as shown in FIGS. 2A-B, in order to address issues of mechanical stability, stress, coefficient of thermal expansion mismatches, etc. A further detailed description related to such attachment to an interposer will avoided for the sake of brevity as it will be substantially similar to the description of FIGS. 2A-B above.

Accordingly, the above described exemplary aspects relate to integrated circuits comprising metal lines from materials such as Tungsten, wherein the metal lines may be Fluorine free. As such, the exemplary Tungsten metal lines eliminate the need for a liner, which may further contribute to lowering resistance, for example in the line width or pitch ranges of less than 30 nm. Deposition of the Tungsten metal lines may be through DD and CMP processes or PVD processes as described above for ICs 100 and 300 respectively. Air gaps of narrow width (e.g., <30 nm) in between at least two Tungsten lines in at least one layer of the integrated circuit reduce capacitance. Interposers such as interposer 150 provide additional integrity, support, and mechanical stability to semiconductor devices encapsulated in packages so that air gap mechanical integrity can be decoupled from mechanical stress introduced by the package. For example, interposer 150 may be stacked on ICs 100/300 comprising air gaps to form a stacked structure before the stacked structure is attached to a laminated package substrate or a printed circuit board (PCB). There may be CTE mismatch between the stacked structure formed from Si and the laminated package substrate or PCB. This CTE mismatch may induce mechanical stress in the semiconductor device, which will be absorbed by interposer 150, thus protecting ICs 100/300 from being impacted by the mechanical stress induced by the CTE mismatch. In this manner the mechanical and structural integrity of the air gaps can be protected by the use of interposers such as interposer 150.

Figure 4:
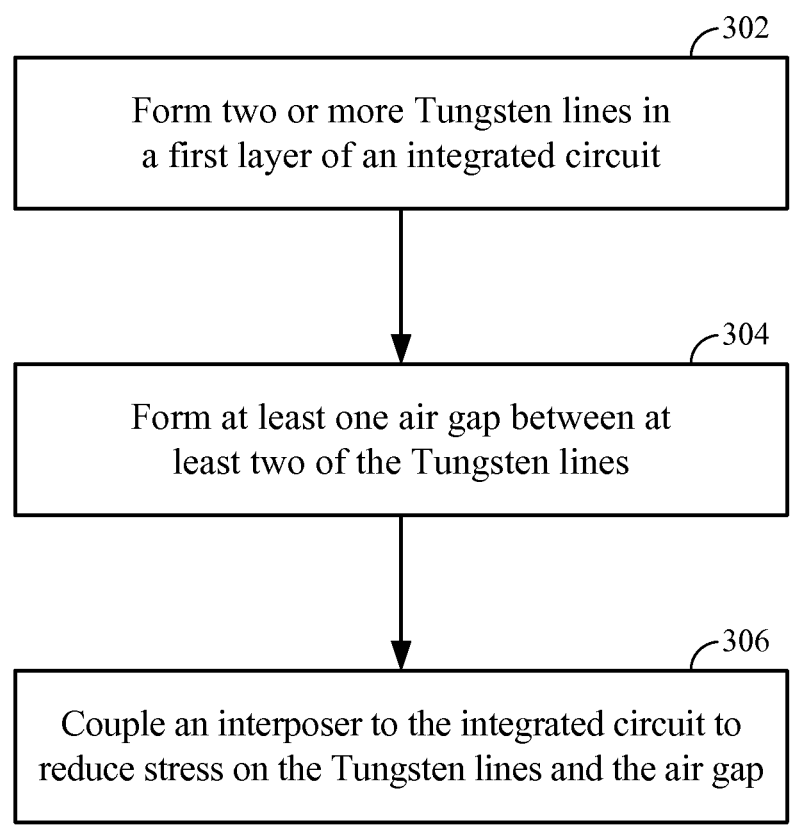
FIG. 4 illustrates a flow chart for formation of an exemplary integrated circuit.

It will be appreciated that embodiments include various methods for performing the processes, functions and/or algorithms disclosed herein. For example, as illustrated in FIG. 4, an embodiment can include a method of forming a semiconductor device (e.g., semiconductor device 200), the method comprising: forming two or more Tungsten lines (e.g., first metal lines 108) in a first layer (e.g., comprising first dielectric layer 106) of an integrated circuit (e.g., integrated circuit 100)—Block 402; forming at least one air gap (e.g., first air gaps 110) between at least two of the Tungsten lines—Block 404; and coupling an interposer (e.g., interposer 150) to the integrated circuit to reduce stress on the Tungsten lines and the air gap—Block 406.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The foregoing disclosed devices and methods may be designed and configured into GDSII and GERBER computer files, stored on a computer readable media. These files may in turn be provided to fabrication handlers who fabricate devices based on these files. The resulting products are semiconductor wafers that may be then cut into semiconductor die and packaged into a semiconductor chip. The chips may then be employed in devices described above. The foregoing devices may be integrated in at least one semiconductor die. Further, the disclosed devices may be integrated in a an electronic device selected from the group consisting of a set top box, music player, video player, entertainment unit, navigation device, communications device, personal digital assistant (PDA), fixed location data unit, and a computer.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for forming integrated circuits comprising metal lines for forming interconnections, where the metal lines are formed from Tungsten (W) with at least one air gap between at least two of the Tungsten metal lines. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A semiconductor device comprising:
   an integrated circuit comprising a first layer comprising two or more Tungsten lines and at least one air gap between at least two Tungsten lines;
   an interposer coupled to the integrated circuit; and
   a laminated package substrate attached to the interposer, wherein the interposer is configured to absorb mechanical stress induced by mismatch in coefficient of thermal expansion (CTE) between the laminated package substrate and the interposer, and to protect the at least one air gap from the mechanical stress.

2. The semiconductor device of claim 1, wherein the two or more Tungsten lines are formed from a Fluorine (F) free process.

3. The semiconductor device of claim 1, wherein the Tungsten lines are deposited by physical vapor deposition (PVD).

4. The semiconductor device of claim 1, further comprising a second layer comprising one or more Tungsten lines, wherein the second layer is separated from the first layer by a cap layer, and wherein the Tungsten lines of the first layer are connected to Tungsten lines of the second layer through vias.

5. The semiconductor device of claim 1, wherein the first layer further comprises an interlayer dielectric material.

6. The semiconductor device of claim 1, wherein the Tungsten lines are formed using dual damascene (DD) or etch, followed by chemical mechanical polishing (CMP).

7. The semiconductor device of claim 1, wherein the at least one air gap is of narrow width.

8. The semiconductor device of claim 1, wherein the interposer is coupled to the integrated circuit using Cu—Cu bonding or hybrid bonding comprising Cu—Cu bonding and oxide-oxide bonding.

9. The semiconductor device of claim 1, wherein the interposer further comprises a dielectric layer and one or more metal lines.

10. The semiconductor device of claim 1 integrated in at least one semiconductor die.

11. The semiconductor device of claim 1, integrated in a device selected from the group consisting of a set top box, music player, video player, entertainment unit, navigation device, communications device, personal digital assistant (PDA), fixed location data unit, and a computer.

12. A method of forming a semiconductor device, the method comprising:
    forming two or more Tungsten lines in a first layer of an integrated circuit;
    forming at least one air gap between at least two of the Tungsten lines;
    coupling an interposer to the integrated circuit; and
    attaching a laminated package substrate to the interposer, wherein the interposer absorbs mechanical stress induced by mismatch in coefficient of thermal expansion (CTE) between the laminated package substrate and the interposer, and protects the at least one air gap from the mechanical stress.

13. The method of claim 12, comprising forming the Tungsten lines from a Fluorine (F) free process.

14. The method of claim 12, comprising forming the Tungsten lines by physical vapor deposition (PVD).

15. The method of claim 12, comprising forming the Tungsten lines using dual damascene (DD) or etch and chemical mechanical polishing (CMP).

16. The method of claim 12, comprising coupling the interposer to the integrated circuit by Cu—Cu bonding or hybrid bonding comprising Cu—Cu bonding and oxide-oxide bonding.

17. A semiconductor device comprising:
    two or more Tungsten lines in a first layer of an integrated circuit;
    means for forming at least one air gap between at least two of the Tungsten lines;
    coupling means coupled to the integrated circuit; and
    a laminated package substrate attached to the coupling means, wherein the coupling means comprises means for absorbing mechanical stress induced by mismatch in coefficient of thermal expansion (CTE) between the laminated package substrate and the coupling means, and means for protecting the at least one air gap from the mechanical stress.

18. The semiconductor device of claim 17, further comprising:
    a second layer comprising one or more Tungsten lines:
    a cap means for separating the second layer from the first layer; and
    and connecting means for connecting the Tungsten lines of the first layer to the Tungsten lines of the second layer.

* * * * *